United States Patent
Grande et al.

(10) Patent No.: US 10,147,490 B2
(45) Date of Patent: Dec. 4, 2018

(54) METHOD FOR REDUCING A MEMORY OPERATION TIME IN A NON-VOLATILE MEMORY DEVICE AND CORRESPONDING NON-VOLATILE MEMORY DEVICE

(71) Applicants: STMicroelectronics S.r.l., Agrate Brianza (IT); STMicroelectronics (Rousset) SAS, Rousset (FR)

(72) Inventors: Francesca Grande, Syracuse (IT); Francesco La Rosa, Rousset (FR); Gianbattista Lo Giudice, Pedara (IT); Giovanni Matranga, Catania (IT)

(73) Assignees: STMicroelectronics S.r.l., Agrate Brianza (MB) (IT); STMicroelectronics (Rousset) SAS, Rousset (FR)

( * ) Notice: Subject to any disclaimer, the term of this patent is extended or adjusted under 35 U.S.C. 154(b) by 7 days.

(21) Appl. No.: 15/607,636

(22) Filed: May 29, 2017

(65) Prior Publication Data
US 2018/0151231 A1 May 31, 2018

(30) Foreign Application Priority Data
Nov. 30, 2016 (IT) .................. 102016000121618

(51) Int. Cl.
*G11C 16/04* (2006.01)
*G11C 16/16* (2006.01)
*G11C 16/34* (2006.01)
*G11C 16/26* (2006.01)

(52) U.S. Cl.
CPC .......... *G11C 16/16* (2013.01); *G11C 16/3445* (2013.01); *G11C 16/26* (2013.01)

(58) Field of Classification Search
CPC ...... G11C 16/16; G11C 16/3445; G11C 16/26
USPC ........................................... 365/218
See application file for complete search history.

(56) References Cited

U.S. PATENT DOCUMENTS

| | | |
|---|---|---|
| 2007/0189080 A1 | 8/2007 | Liu et al. |
| 2008/0144396 A1 | 6/2008 | Chang et al. |
| 2013/0176784 A1* | 7/2013 | Cometti .............. G11C 11/5642 365/185.11 |

FOREIGN PATENT DOCUMENTS

CN 104575603 A 4/2015

* cited by examiner

*Primary Examiner* — Huan Hoang
(74) *Attorney, Agent, or Firm* — Slater Matsil, LLP

(57) ABSTRACT

A method can be used for reducing a memory operation time in a non-volatile memory device having a memory array with a number of memory cells. The method includes performing a first execution of the memory operation on a set of memory cells by applying a first biasing configuration, storing information associated to the first biasing configuration, and performing a second execution, subsequent to the first execution, of the memory operation on the same set of memory cells by applying a second biasing configuration that is determined according to the stored information associated to the first biasing configuration.

21 Claims, 5 Drawing Sheets

| Sector | Configuration |
|---|---|
| 0 | 03 |
| 1 | 01 |
| 2 | 02 |
| ... | ... |
| N | 03 |

METHOD FOR REDUCING A MEMORY OPERATION TIME IN A NON-VOLATILE MEMORY DEVICE AND CORRESPONDING NON-VOLATILE MEMORY DEVICE

CROSS-REFERENCE TO RELATED APPLICATIONS

This application claims priority to Italian Patent Application No. 102016000121618, filed on Nov. 3, 2016, which application is hereby incorporated herein by reference.

TECHNICAL FIELD

The present invention relates to a method for reducing a memory operation time in a non-volatile memory device, and to a corresponding non-volatile memory device.

BACKGROUND

As it is known, and as shown schematically in FIG. 1, a memory cell 1, of the floating-gate type, of a non-volatile memory device, for example of a flash type, generally comprises: a bulk region 2, for example, with a p-type doping, provided in a substrate 3 of semiconductor material, for example silicon; a source region 4 and a drain region 5, for example with a n-type doping, provided within a surface portion of the bulk region 2; a floating-gate region 6, arranged above the bulk region 2 and separated from the same bulk region 2 by a tunnel-oxide region 7; and a control-gate region 8, arranged above the floating-gate region 6 and separated therefrom by an intermediate oxide (the so-called "ONO") region 9.

For storing information, electric charges are injected from the substrate 3 into the floating-gate region 6 (program operation), thus varying the threshold of the memory cell 1, i.e., the voltage to be applied between the control-gate region 8 and the source region 4 to switch-on the memory cell 1 and obtain conduction of electric current between the source region 4 and the drain region 5.

The reading operation, upon application of an appropriate biasing voltage to the control-gate region 8, detects the conduction characteristic of the memory cell 1, from which it is possible to obtain the stored information.

The erase operation for erasing the information envisages removal of the electric charge stored in the floating-gate region 6, via electron extraction. In particular, this operation envisages (as illustrated in FIG. 1) application of a high electrical field between the bulk region 2, which is brought to a high voltage of a positive value (for example +10 V), and the control-gate region 8, which is brought to a high voltage of a negative value (for example −10 V). In a known manner, the high electrical field that is generated is such as to trigger the FN tunneling effect, which causes movement of the electrons, which migrate from the floating-gate region 6 through the tunnel-oxide region 7 (once again, as illustrated schematically in FIG. 1).

In particular, in a known manner, the erase operations are generally carried out simultaneously on a set of memory cells 1, belonging for example to a same block, sector, or page, of the non-volatile memory device, these cells being thus erased together in a same erase operation.

Evidently, the erase process is effective only if the applied electrical field has a value sufficient to trigger the FN tunneling effect.

On account of the natural process of degradation of the memory cells 1 (for example, due to charge trapping in the tunnel-oxide region 7), this value, however, increases as the so-called "cycling" (i.e., the number of program/erase cycles undergone by the same memory cells 1) increases.

In order to take into account this degradation phenomenon, an algorithm commonly used for carrying out the erase operation on a set (sector or page) of memory cells 1 envisages iterative application of a certain number of pulses, of an increasing voltage value and of a fixed duration, each followed by a verify operation for verifying that erase has been successful. The method is interrupted as soon as the verify operation determines that erase has been correctly performed.

This erase algorithm is illustrated schematically in FIG. 2, which shows the plot, with pulses of increasing value, of the bulk voltage $V_{pp}$, with the control-gate region 8 negatively selected (i.e., set at a voltage $V_{CG}$ of a high negative value, for example −10 V). As previously mentioned, the potential difference between the bulk region 2 and the control-gate region 8 determines the electrical field designed to trigger the FN tunneling effect.

The pulses of the bulk voltage $V_{pp}$ start from a minimum value $V_{pp\_min}$, determined in the stage of design or characterization of the non-volatile memory device, and increase, with constant steps, up to a maximum value $V_{pp\_max}$, which is also determined during design or characterization of the memory device. Between successive pulses, the algorithm envisages a verify step, through a reading operation, to verify that erase has been successful.

If the verification does not yield a positive result, a subsequent pulse is iteratively applied, with an incremented value; otherwise, when it is verified that erase has been successful (i.e., when it is verified that the value of electrical field required for activation of the FN tunneling effect has been reached or crossed, as shown once again in FIG. 2) the process ends.

The envelope of all the pulses applied (represented with a dashed line) determines the slope with which the erase operation is carried out, i.e., the variation in time of the electrical field applied to the memory cells 1, and the rate at which the electrical field reaches and/or crosses the value required for activation of the FN tunneling effect. In a known way, this slope must not be too high in order to prevent excessive stresses on the memory cells 1; this slope thus has an impact on the duration of the erase operation.

As indicated previously, as the number of program/erase cycles carried out on the memory cells 1 increases, the value of electrical field required for activation of the FN tunneling effect increases, so that the number of pulses required for reaching effective erase of the memory cells 1 also increases, with consequent increase in the overall duration of the erase operation.

As indicated schematically in FIG. 3, as cycling increases, the number of pulses that are required by the erase operation increases accordingly: in the example, from one or two pulses required for erasing memory cells with cycling lower than 10 Kc or 50 Kc, to a number N−1 or N of pulses (with N for example equal to 10) required for erasing memory cells with cycling of 450 Kc or 500 Kc.

Considering a constant duration $T_{pulse}$ for the various pulses, the time required for the erase operation is thus short for cells with low cycling, but may become very long for cells with high cycling, possibly becoming incompatible with certain applications of the memory device (in which, for example, a high response rate or, in any case, a pre-set response time substantially constant over time is required).

SUMMARY

Embodiments of the present invention relate to a method for reducing a memory operation time in a non-volatile memory device and corresponding non-volatile memory device.

Embodiments of the present invention solve, at least in part, problems highlighted previously in order to provide a solution that will enable reduction of the duration of an operation carried out in the non-volatile memory device, in particular the erase operation on a set of memory cells.

For example, in one embodiment a method is used for reducing a memory operation time in a non-volatile memory device that has a memory array including a plurality of memory cells. The method comprises performing a first execution of the memory operation on a set of the memory cells by applying a first biasing configuration; storing information associated to the first biasing configuration; and performing a second execution, subsequent to the first execution, of the memory operation on the same set of memory cells by applying a second biasing configuration that is determined according to the stored information associated to the first biasing configuration.

The following description will make specific reference, without this implying any loss of generality, to a reduction of an operation time for erasing a set or group of memory cells (for example, a page or a sector of memory cells) in a non-volatile memory device to be erased through the Fowler-Nordheim (FN) tunneling effect, such as a memory device of a flash, page-flash, or e-STM (embedded Select Trench Memory) type.

BRIEF DESCRIPTION OF THE DRAWINGS

For a better understanding of the present solution, preferred embodiments thereof are now described, purely by way of non-limiting example, with reference to the attached drawings, wherein.

DETAILED DESCRIPTION OF ILLUSTRATIVE EMBODIMENTS

The present solution stems from the realization, by the present Applicant, that, in the iterative algorithm described for the memory operation (in particular for the erase operation), the pulses supplied before obtaining the desired result (in particular, before reaching the value of electrical field that triggers the FN tunneling effect) are of no effect for the purposes of the same memory operation, being in fact only intermediate steps aimed at achieving the result.

Based on this realization, and as will be highlighted in detail hereinafter, one aspect of the present solution thus envisages storing information associated to the operating configuration that has allowed to correctly perform a past memory operation, and using this information for restoring the corresponding operating configuration as the starting point for a subsequent memory operation.

In this way, it is possible to speed up significantly the memory operation time, without jeopardizing the reliability thereof.

Figure 1:
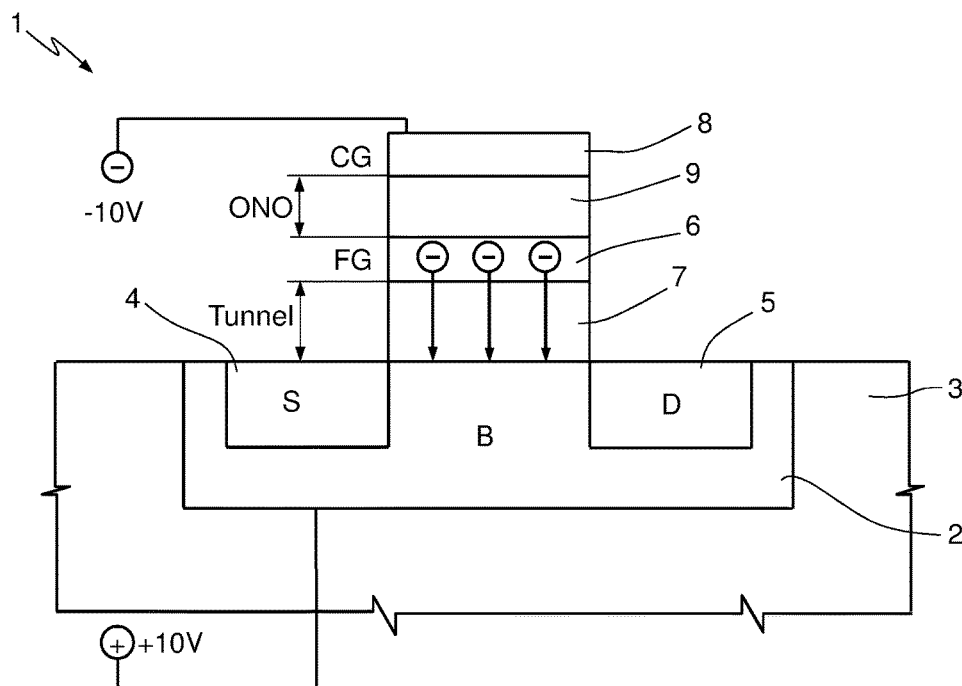
FIG. 1 shows a schematic cross-sectional view of a floating-gate memory cell in a non-volatile flash-memory device.
Figure 2:
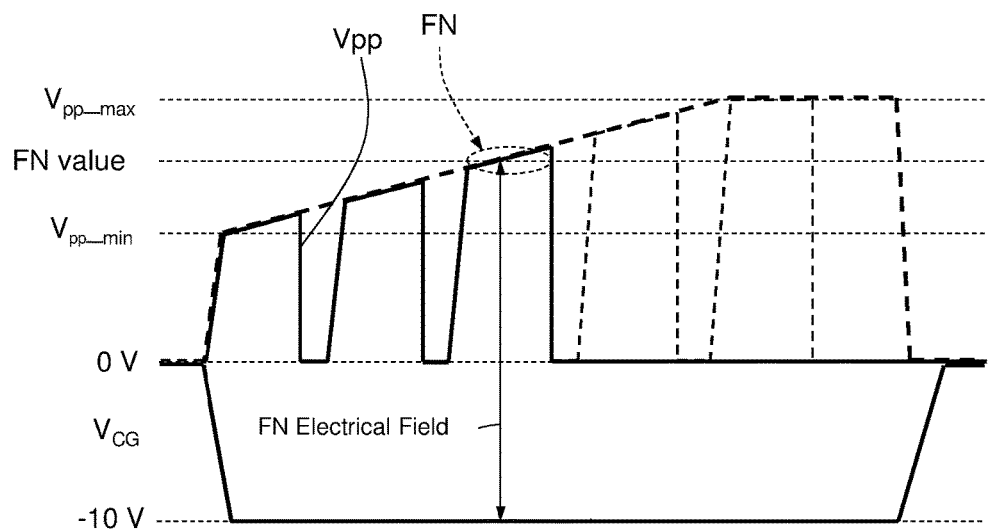
FIGS. 2 and 3 show the plot, during an erase operation, of a voltage applied to the memory cell.
Figure 3:
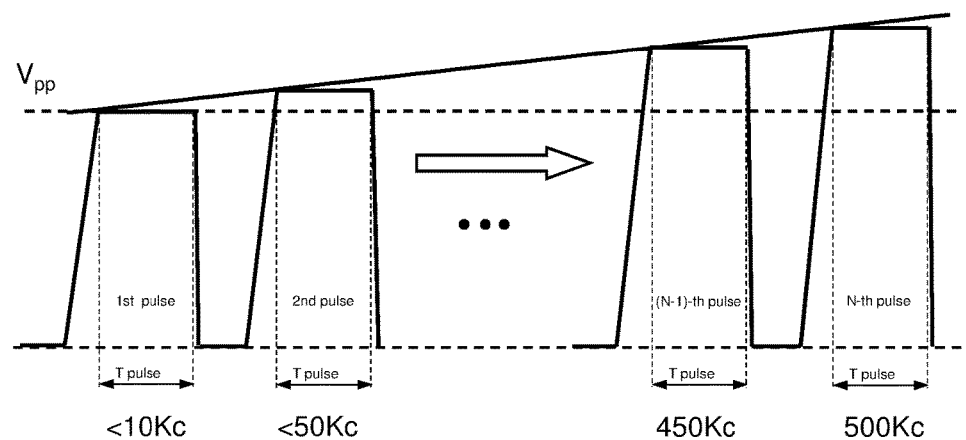
Figure 4:
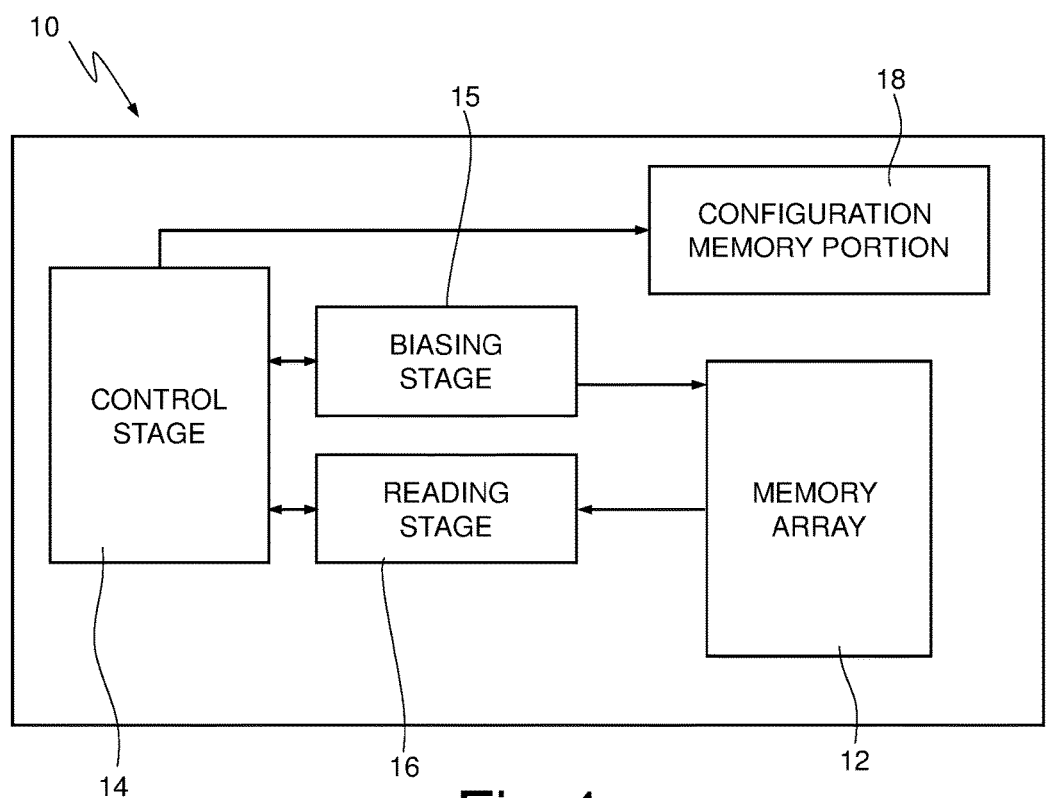
FIG. 4 is a general block diagram of a non-volatile memory device.

In detail, and with initial reference to FIG. 4, a memory device 10, of a non-volatile type, for example of a flash or page-flash type, generally comprises a memory array 12, including a plurality of memory cells 1, of the floating-gate type (for example, as described with reference to FIG. 1), arranged in rows (word lines) and columns (bit lines) and operatively grouped together in sets (for example, sectors or pages). In particular, a memory operation, for example an erase operation for erasing the information stored in the memory cells 1 is carried out in the memory device 10 simultaneously for all the memory cells 1 belonging to a same set (for example, sector or page).

The memory device 10 further comprises a control unit 14, for example, including a microprocessor or microcontroller, which is operatively associated to the memory array 12 and is designed to control operation thereof and in particular to control execution of the memory operations, amongst which, for example, the erase operation.

The memory device 10 further comprises: a biasing stage 15, controlled by the control unit 14 for supplying appropriate biasing signals to the memory cells 1 of the memory array 12 during the memory operations (for example, the aforesaid pulsed bulk voltage $V_{pp}$, during the erase operation); and a reading stage 16, which is also controlled by the control unit 14, for carrying out reading of the contents of the memory cells 1 (for example, for verifying correct erasing during the erase operation).

The memory device 10 further comprises a configuration memory portion 18, managed by the control unit 14 and which is not accessible to the user of the memory device 10 for memory operations. Information of the configuration of the memory device 10 is, in general, stored in this configuration memory portion 18.

Figure 5:
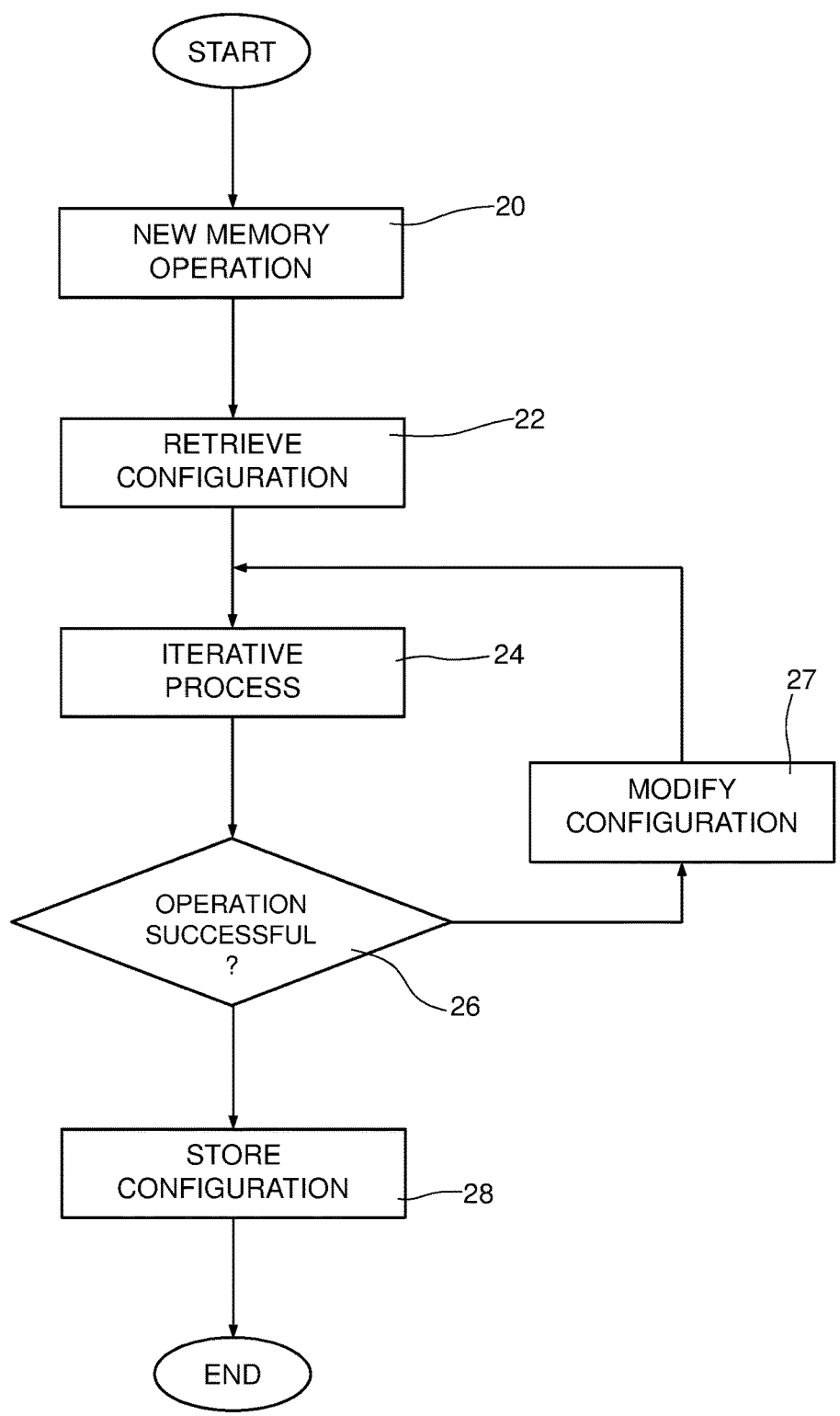
FIG. 5 is a flowchart regarding operations carried out by the method according to the present solution.

In particular, and as shown schematically in FIG. 5, the control unit 14 is configured (step 20) to determine the need to carry out a new memory operation (for example, the aforesaid erase operation) that envisages an iterative process of application of a biasing configuration (for example, including an appropriate value of the aforesaid bulk voltage $V_{pp}$) to a set of memory cells 1, and of verification of effective execution of the desired operation (for example, erase of the same memory cells 1). At each new step of the iterative process, which is carried out if the verify operation yields a negative result, the control unit 14 determines a new biasing configuration for a new execution of the memory operation.

According to an aspect of the present solution, as mentioned previously, the control unit 14 is configured to store information associated to the biasing configuration that has been verified as being effective during a past memory operation performed on a set of memory cells 1. The control unit 14 stores this information, for example within the configuration memory portion 18 of the memory device 10, in combination with the specific set of memory cells ion which the past memory operation has been carried out.

When it is necessary to perform a new memory operation on the same set of memory cells 1, the control unit 14 retrieves (step 22), from the configuration memory portion 18, the stored information associated to the biasing configuration, and uses this same biasing configuration in a first step of the iterative process that is then implemented for carrying out the new memory operation (step 24).

At the end of each step of the iterative process, the control unit 14 verifies (step 26) whether the memory operation has been successful: if it has not been successful, the control unit 14 determines a new step of the iterative process, determining in particular a modification (step 27), of the biasing configuration (for example, an increment in the level of the aforesaid bulk voltage $V_{pp}$); otherwise, if it has been successful (step 28), the control unit ends the iterative process and stores within the configuration memory portion 18 the new biasing configuration that has been determined as being effective, in combination with the aforesaid set of memory cells 1.

In greater detail, and with reference to an erase operation of the data stored in a set of memory cells 1, the biasing stage 15 may comprise a digital-to-analog converter (DAC), which receives a digital control signal DAC_IN from the control unit 14 and generates accordingly the pulsed bulk voltage $V_{pp}$, the level of which corresponds to the digital control signal received.

Figure 6A:
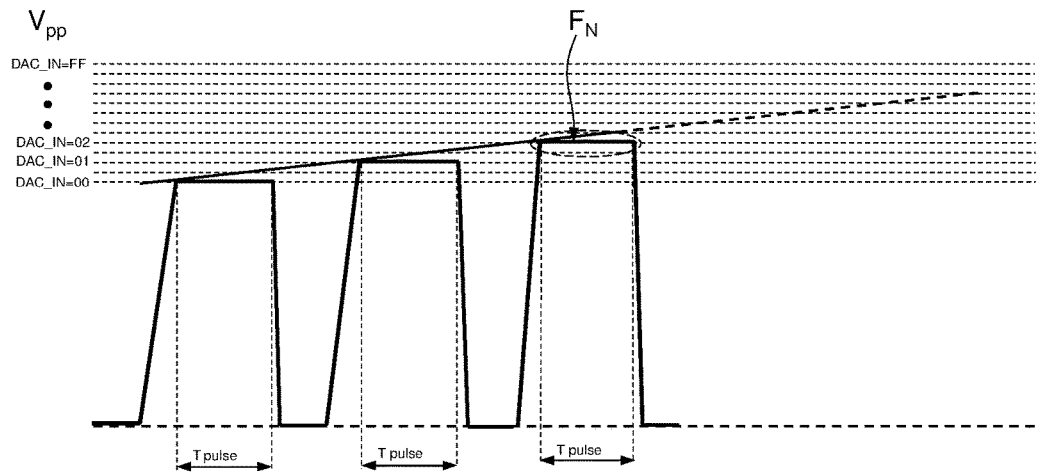
FIGS. 6A and 6B show the plot, during an erasure operation, of a voltage applied to the memory cell, in different cycling conditions.

As illustrated in FIG. 6A, the iterative algorithm envisages generation, in consecutive steps, of pulses of increasing value (each of which with an incremented value of the digital control signal DAC_IN), until the level of the actual pulse of the bulk voltage $V_{pp}$ reaches or exceeds the threshold for triggering of the FN tunneling effect. In the example shown, the verification carried out following supply of the third pulse (corresponding to the digital control signal DAC_IN="02" received from the control unit 14) determines effective erase of the memory cells 1 of the desired set (for example, a page or a sector), after the application of a first pulse (in the example, corresponding to the minimum value determined in a design or characterization stage) and of a second pulse has not led to triggering of the FN tunneling effect.

Consequently, the control unit 14 stores information associated to the actual biasing configuration, for example the actual level of the bulk voltage $V_{pp}$, or, likewise, the last value of the digital control signal DAC_IN, within the configuration memory portion 18.

Figure 6B:
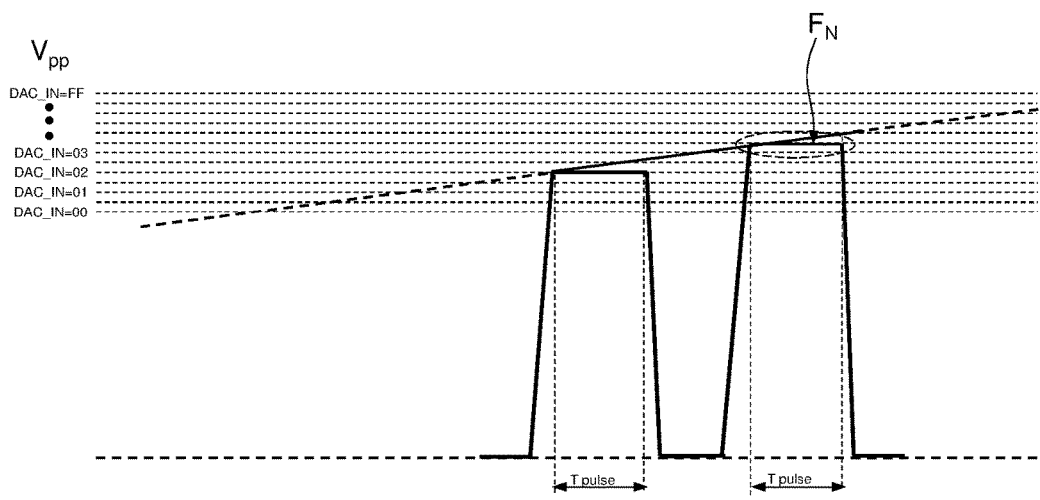

Next (FIG. 6B), at a new erase operation on the same set of memory cells 1, the control unit retrieves from the configuration memory portion 18 the previously stored information (in the example, the level of the bulk voltage $V_{pp}$, or the last value of the digital control signal DAC_IN) so as to determine the biasing configuration of the first step of the iterative process according to the information retrieved. In the example, the level of the first pulse of the bulk voltage $V_{pp}$ is the value stored (for which the erase operation previously performed was successful), and the new erase operation is found to be effective following upon application of a second pulse (the level of which will be stored by the control unit 14 for the subsequent memory operation).

Figures 7, 8:
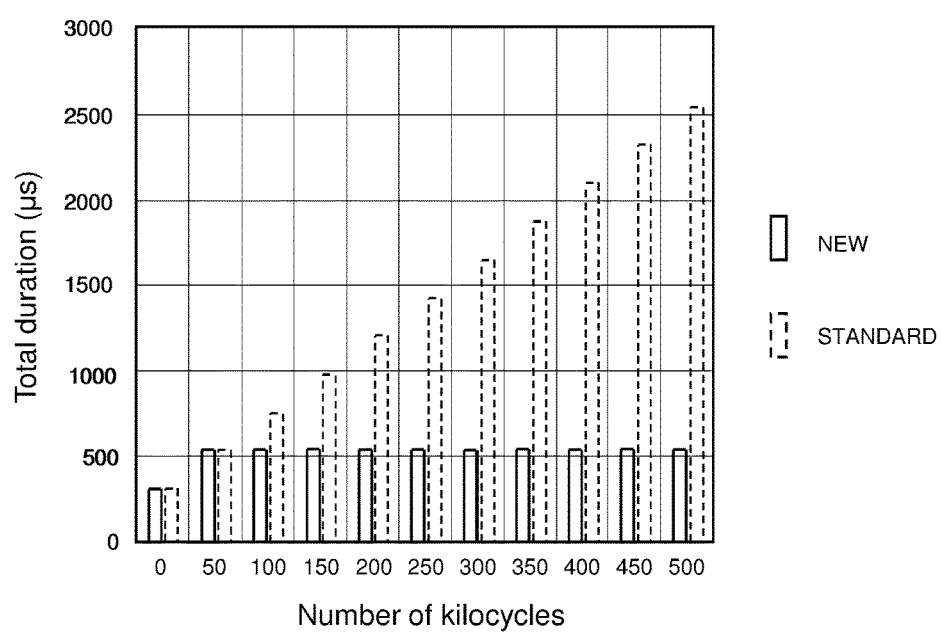
FIG. 7 is a schematic representation of a configuration memory portion in the non-volatile memory device.
FIG. 8 is a plot showing a memory operation time in the non-volatile memory device.

As illustrated schematically in FIG. 7, the aforesaid configuration memory portion 18 may comprise a look-up table (LUT) having a first field 18a, "Sector", containing a reference associated to a sector (or page, or other type of group) of memory cells 1, and a second field 18b, "Configuration", in which, in association with the corresponding sector, the last configuration used for the memory operation is stored (for example, the last level of the bulk voltage $V_{pp}$ that was used successfully for carrying out an erase operation, or, likewise, the digital value of the corresponding digital control signal DAC_IN).

The advantages of the solution proposed emerge clearly from the foregoing description.

In any case, it is emphasized again that this solution enables considerable reduction in the duration of the memory operations, for example of the erase operations on sets of memory cells (such as sectors or pages), irrespective of the cycling of the same memory cells.

In this regard, FIG. 8 shows a comparison plot of the duration of the erase operation (determined with statistical considerations) as a function of the number of program/erase cycles carried out by the memory cells, in the case of the present solution (represented with a solid line) and in the case of a known solution (represented with a dashed line).

As highlighted by the plot, whereas a progressive increase of the total duration of the erase operation occurs in the case of the traditional solution (due to the increase in the number of pulses of the bulk voltage $V_{pp}$ to be supplied prior to effective erase), in the case of the present solution the duration remains substantially constant, one or two pulses being in fact generally required for carrying out correct erase (thanks to the fact that the iterative process always starts from the last level reached in the course of the past operation, as described above).

The solution described further enables reduction of the stresses to which the memory cells are subjected during the memory operations (such as erase), given that the biasing configuration applied does not substantially differ from the one effectively required by the same memory operations (for example, the level of the biasing pulses applied is neither much higher nor much lower than what is effectively required for the erase operation).

The reliability and service life of the memory device 10 are thus advantageously increased as compared to traditional solutions.

Also the power-consumption levels are reduced, thanks to the smaller number of iterative steps performed by the algorithm and, for example, to the lower number of biasing pulses and of consequent reading verifications to be carried out.

Further, it is emphasized that the algorithm proposed does not envisage any limitation as regards the maximum number of steps performed by the iterative process for carrying out the memory operation, in effect simply eliminating the preliminary steps, which are considered unnecessary for achieving the desired result.

In general, the solution proposed may thus advantageously be applied to memory devices in apparatuses with high safety levels (in the sectors of telecommunications, pay-TV, field banking, etc.), in microcontrollers (for domotic applications, for radiofrequency applications, for display apparatuses), or in general in the automotive field.

Finally, it is clear that modifications and variations may be made to what has been described and illustrated herein, without thereby departing from the scope of the present invention, as defined in the appended claims.

In particular, the information stored in association with the biasing configuration that has been verified as being effective during a past memory operation may regard the last configuration used, or else one or more of the previous configurations, for example the next-to-last one, or the second-to-last one. In this case, the first step of the iterative process for the subsequent memory operation corresponds to the one or more of the previous configurations.

For example, in the case of the erase operation described previously, the control unit 14 may store, instead of the last level of the bulk voltage $V_{pp}$ that has led to effective erase of the memory cells 1, one or more of the previous levels (for example, the next-to-last level or the second-to-last level) and/or the corresponding value of the digital control signal DAC_IN.

This variant of the solution may be advantageous in the case where, between one memory operation and the next, variations of the operating conditions there occur, for example variations in temperature, which could vary the level required for activation of the FN tunneling effect. In this case, in fact, starting the iterative process from one or more previous configurations allows compensation for this variation.

Moreover, the same information stored may be of a different type, provided that it represents the biasing configuration used for the memory operation. For example, in the case of the erase operation on the memory cells 1, as an alternative, or in addition, to the level of the pulses of the bulk voltage $V_{pp}$, a duration of the pulses (if the same duration is variable), or else the incremental number of the pulses (if both the duration and the incremental step between successive pulses are constant) could be stored.

It is also emphasized that the solution described may be applied in general to any memory operation that may be optimized on the basis of the knowledge of the configuration of the previous memory operation carried out on the same memory cells, and may be applied to any non-volatile memory device.

For example, the solution described may be applied to programming operations carried out in the non-volatile memory device in the case where (for reasons of power consumption or the like) a programming operation is required having a reduced parallelism, so that the duration thereof may be considerable.

What is claimed is:

1. A method for reducing a memory operation time of a memory operation in a non-volatile memory device having a memory array including a plurality of memory cells, the method comprising:
    performing a first execution of the memory operation on a set of the memory cells by applying a first biasing configuration, wherein applying the first biasing configuration comprises:
        applying a first initial biasing configuration to the set of the memory cells,
        iteratively changing a biasing configuration of the set of the memory cells starting from the first initial biasing configuration, and
        each time the biasing configuration is changed, determining whether the memory operation has been successful, wherein the first biasing configuration corresponds to the biasing configuration determined as successful;
    storing information associated with the first biasing configuration in a configuration memory portion; and
    performing a second execution immediately subsequent to the first execution of the memory operation on the same set of memory cells by applying a second biasing configuration, wherein applying the second biasing configuration comprises:
        reading the first biasing configuration from the configuration memory portion, and
        applying a second initial biasing configuration based on the first biasing configuration.

2. The method according to claim 1, wherein performing the second execution of the memory operation comprises performing an iterative algorithm, starting from the second initial biasing configuration, that performs, at each step, an iterative variation of the biasing configuration and a verification that the memory operation has been successful.

3. The method according to claim 1, wherein the information stored in the configuration memory portion includes operating parameters of the biasing configuration of a last step of the iteratively changing the biasing configuration starting from the first initial biasing configuration.

4. The method according to claim 1, wherein the information stored in the configuration memory portion includes operating parameters of the biasing configuration of one or more steps prior to a last step of the iteratively changing the biasing configuration starting from the first initial biasing configuration.

5. The method according to claim 1, wherein the memory cells comprise floating-gate memory cells, each memory cell including a bulk region and a control-gate region;
    wherein the memory operation is an operation of erase of a set of the memory cells; and
    wherein the biasing configuration includes a biasing voltage applied between the control-gate region and the bulk region of the memory cells.

6. The method according to claim 5, wherein iteratively changing the biasing configuration comprises iteratively applying a pulsed biasing voltage between the control-gate region and the bulk region, and, at each step, iteratively varying one or more characteristics of the pulses, wherein the information stored associated to the first biasing configuration comprises information regarding the one or more characteristics.

7. The method according to claim 6, wherein the one or more characteristics comprise a level and/or duration of the pulses, and wherein iteratively changing the biasing configuration iteratively incrementing the level and/or duration.

8. The method according to claim 6, wherein the information stored comprises a level of a pulse of the biasing voltage between the control-gate region and the bulk region applied in a last step carried out by the iteratively changing the biasing configuration, and wherein the second biasing configuration includes an application of a pulse of a respective biasing voltage between the control-gate region and the bulk region having a value that is a function of the stored level.

9. The method according to claim 1, wherein the set of the memory cells corresponds to a sector or a page of the memory array.

10. A non-volatile memory device, comprising:
    a memory array having a plurality of memory cells;
    a configuration memory portion;
    a control unit operatively coupled to the memory array; and
    a biasing stage, controlled by the control unit for applying a biasing configuration;
    wherein the control unit is configured to:
        control the biasing stage to perform a first execution of a memory operation on a set of the memory cells by applying a first biasing configuration, wherein applying the first biasing configuration comprises:
            applying a first initial biasing configuration to the set of the memory cells,
            iteratively changing a biasing configuration of the set of the memory cells starting from the first initial biasing configuration, and
            each time the biasing configuration is changed, determining whether the memory operation has been successful, wherein the first biasing configuration corresponds to the biasing configuration determined as successful;

store information associated to the first biasing configuration in the configuration memory portion; and control the biasing stage to perform a second execution immediately subsequent to the first execution of the memory operation on the set of the memory cells by applying a second biasing configuration, wherein applying the second biasing configuration comprises:

reading the first biasing configuration from the configuration memory portion, and applying a second initial biasing configuration based on the first biasing configuration.

11. The device according to claim 10, wherein the control unit is configured to send a control signal to the biasing stage in order to determine the biasing configuration, and wherein the information stored includes operating parameters of the control signal.

12. The device according to claim 10, wherein the memory cells are floating-gate memory cells, each memory cell including a bulk region and a control-gate region.

13. The device according to claim 12, wherein the memory operation is an erase operation for the set of the memory cells, and the biasing configuration includes a voltage applied between the control-gate region and the bulk region of the memory cells.

14. The device according to claim 13, wherein iteratively changing the biasing configuration comprises iteratively applying, by the biasing stage, of a pulsed biasing voltage between the control-gate region and the bulk region, and, at each step, iteratively varying one or more characteristics of the pulses, wherein the information stored associated to the first biasing configuration comprises information regarding the one or more characteristics.

15. The device according to claim 10, wherein the set of the memory cells corresponds to a sector or a page of the memory array.

16. A non-volatile memory device, comprising:

a memory array having a plurality of non-volatile memory cells;

a control unit operatively coupled to the memory array;

a memory configured to store information regarding a biasing configuration; and a biasing stage, controlled by the control unit for applying the biasing configuration, wherein the control unit is configured to update the information stored in the memory during each subsequent performances of the memory operation, wherein the memory comprises a look-up table having a first field configured to store a reference associated to one or more of the plurality of non-volatile memory cells and a second field configured to store a last configuration used by the one or more of the of the plurality of non-volatile memory cells referenced in the first field.

17. The non-volatile memory device according to claim 16, wherein the control unit is configured to:

control the biasing stage to perform a first execution of the memory operation on a set of the non-volatile memory cells by applying the biasing configuration stored in the memory;

update the memory with updated information associated with the first execution of the memory operation; and control the biasing stage to perform a second execution, subsequent to the first execution, of the memory operation on the same set of memory cells by applying a second biasing configuration determined according to the updated information.

18. The device according to claim 10, wherein the biasing stage comprises a digital-to-analog converter (DAC), and wherein the first biasing configuration corresponds to a value of a control signal of the DAC.

19. The non-volatile memory device according to claim 16, wherein the control unit is configured to:

control the biasing stage to perform a first execution of the memory operation on a set of the non-volatile memory cells by applying the biasing configuration stored in the memory, wherein applying the biasing configuration comprises:

applying a first initial biasing configuration to the set of non-volatile memory cells based on the biasing configuration stored in the memory, iteratively changing the biasing configuration starting from the first initial biasing configuration, and each time the biasing configuration is changed, determining whether the memory operation has been successful;

update the memory with updated information associated with the first execution of the memory operation; and control the biasing stage to perform a second execution, immediately subsequent to the first execution, of the memory operation on the same set of memory cells by applying a second biasing configuration determined according to the updated information.

20. The non-volatile memory device according to claim 19, wherein the information stored in the memory includes operating parameters of the biasing configuration of one or more steps prior to a last step of the iteratively changing the biasing configuration starting from the first initial biasing configuration.

21. The non-volatile memory device according to claim 16, wherein the non-volatile memory cells are floating-gate memory cells, each non-volatile memory cell including a bulk region and a control-gate region, and wherein the biasing configuration comprises a voltage applied between the control-gate region and the bulk region of the memory cells.

* * * * *